US007335872B2

United States Patent
Fukuda et al.

(10) Patent No.: US 7,335,872 B2
(45) Date of Patent: *Feb. 26, 2008

(54) PHOTOCURRENT AMPLIFIER CIRCUIT AND OPTICAL PICK-UP DEVICE

(75) Inventors: Hideo Fukuda, Kyoto (JP); Shinichi Miyamoto, Kyoto (JP)

(73) Assignee: Matsushita Electric Industrial Co., Ltd, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/531,451

(22) Filed: Sep. 13, 2006

(65) Prior Publication Data

US 2007/0075222 A1   Apr. 5, 2007

(30) Foreign Application Priority Data

Sep. 30, 2005   (JP)   .............................. 2005-289088

(51) Int. Cl.
*H03F 3/08*   (2006.01)

(52) U.S. Cl. .................................. 250/214 A; 330/308

(58) Field of Classification Search ............ 250/214 A, 250/214 AG; 330/308, 252, 254, 260, 261
See application file for complete search history.

(56) References Cited

U.S. PATENT DOCUMENTS

| 5,952,883 | A  * | 9/1999  | Masuta ........................ 330/279 |
| 6,747,515 | B2 * | 6/2004  | Callahan, Jr. ................ 330/254 |
| 2003/0231574 | A1 | 12/2003 | Okuda et al. |
| 2006/0103472 | A1 | 5/2006  | Fukuda et al. |
| 2006/0220747 | A1* | 10/2006 | Kiji ............................. 330/308 |
| 2006/0273243 | A1* | 12/2006 | Suzunaga ............... 250/214 A |
| 2007/0045519 | A1* | 3/2007  | Fukuda et al. .......... 250/214 A |

FOREIGN PATENT DOCUMENTS

JP    2004-022051    1/2004

OTHER PUBLICATIONS

English language Abstract of JP 2004-022051.
U.S. Appl. No. 11/533,413 to Murao et al., which was filed on Sep. 20, 2006.
U.S. Appl. No. 11/554,742 to Fukuda et al., which was filed on Oct. 31, 2006.

* cited by examiner

*Primary Examiner*—Georgia Epps
*Assistant Examiner*—Suezu Ellis
(74) *Attorney, Agent, or Firm*—Greenblum & Bernstein, P.L.C.

(57) ABSTRACT

A photocurrent amplifier circuit which can be realized as a simple and downsized photocurrent amplifier circuit is capable of selectively amplifying, in an amplifier circuit in an output stage, one or more of current signals which are respectively obtainable from light receiving circuits. The photocurrent amplifier circuit includes: light receiving circuits; amplifier devices associated with the light receiving circuits; device selector switches which apply input voltages, which deactivate the amplifier devices, to the associated amplifier devices; and a differential amplifier circuit having an inverting input unit configured of the amplifier devices which are connected in parallel. The inputs of the amplifier devices and the output of the differential amplifier circuit are connected by gain resistors. The differential amplifier circuit amplifies, into voltage signals, current signals flowing from the light receiving circuits which are respectively associated with the gain resistors.

11 Claims, 5 Drawing Sheets

PHOTOCURRENT AMPLIFIER CIRCUIT AND OPTICAL PICK-UP DEVICE

BACKGROUND OF THE INVENTION (1) Field of the Invention

The present invention relates to a photocurrent amplifier circuit and an optical pick-up device in which the photocurrent amplifier circuit is used, and particularly to a technique which realizes a simple and downsized photocurrent amplifier circuit.

(2) Description of the Related Art

These days, optical disc media such as Compact Discs (CDs) and Digital Versatile Discs (DVDs) have been widely used for recording of large-capacity digital information represented by video and audio. As is commonly known, in order to read and/or write information from and/or to these various types of optical disc media (hereinafter simply referred to as media), laser lights with different wavelengths are used depending on the types of such media.

A conventional downsized optical pick-up device compliant with any of CDs and DVDs typically includes a two-wavelength semiconductor laser device which is used as a light source and a single optical system which is used in common for both wavelengths of the laser lights. Subsequently, through the optical system, the respective lasers are projected onto points on the medium, which are different for each of the wavelengths which are dependent on the distance between the emitting points of the lasers having the respective wavelengths. By performing photo-electric conversion of the light reflected from the medium using light receiving devices set for the respective wavelengths, an electric signal is obtained, amplified and outputted.

As a light receiving amplifier device suitable for such an optical pick-up device, a light receiving amplifier device, configured of differential amplifiers set for individual light receiving devices with different wavelengths and an output amplifier which selectively amplifies one of the outputs of the differential amplifiers, is well known (for example, refer to FIG. 3 and FIG. 4 of Patent Reference 1: Japanese Laid-Open Patent No. 2004-22051).

However the circuit characteristics of the conventional light receiving amplifier devices substantially depend on the characteristics of the differential amplifiers in the input stage. Thus, in order to obtain a favorable circuit gain which is different for each of light receiving devices, it is necessary to manage the characteristics of the differential amplifiers for each of the light receiving devices with high precision.

Therefore, in an attempt to streamline the design phase, for example, another circuit configuration can he conceived which gains desirable circuit characteristics by providing the minimal number of amplifier devices required for transmitting a signal in the vicinity of each light receiving device (in other words, an originating point of a signal) as well as by using a gain-switchable output amplifier circuit for each light receiving device in common. However, none of the conventional technology suggests such circuit configuration.

The present invention has been conceived in view of such circumstances, and the object of this invention is to provide a photocurrent amplifier circuit which is suitable for use in such circuit configuration.

SUMMARY OF THE INVENTION

In order to solve above problem, the photocurrent amplifier circuit includes: a differential amplifier circuit configured to have an input unit including amplifier devices which are connected in parallel; device selector switches, each of which is set for an associated one of the amplifier devices and applies an input voltage to the associated amplifier device, the input voltage deactivating the amplifier device; gain resistors, each of which connects an input of an associated one of the amplifier devices with an output of the differential amplifier circuit; light receiving circuits, each of which is set for an associated one of the amplifier devices and generates a voltage signal in accordance with an amount of received light; and input resistors, each of which connects an input of an associated one of the fight receiving circuits with an output of each of the amplifier devices, wherein the differential amplifier circuit amplifies a current signal which flows from each of the light receiving circuits via an associated one of the input resistors into an associated one of the gain resistors.

With this configuration, the deactivated amplifier devices are equivalently open. The current signal which flows from the light receiving circuits associated with the other activated amplifier devices are amplified by the single differential amplifier circuit. This photocurrent amplifier circuit is realized by setting amplifier devices for the respective light receiving circuits in an inverting input unit of the differential amplifier circuit and device selector switches. Therefore, the space for the circuit part needed for the respective light receiving circuits is restricted to small space. By designating this photocurrent amplifier circuit as a photocurrent amplifier circuit in an output stage, it is possible to realize a simple and downsized photocurrent amplifier circuit which selectively amplifies one or more of the current signals which flow into the light receiving circuits.

In addition, the photocurrent amplifier circuit further may include load control circuits, each of which is configured to have a load resistor and a load short switch connected in parallel, the load control circuit being connected in series with an associated one of the gain resistors and being set between the output of the differential amplifier circuit and the input of an associated one of the amplifier devices.

In addition, in the photocurrent amplifier circuit, it is preferable that each load resistor may have a value which is greater than a value of the gain resistor which is connected in series with the load resistor.

With this configuration, it is possible to keep internal output loss small by: short-circuiting a load short switch associated with an amplifier device which is performing an amplification operation so as to amplify the current signal at an amplification rate which is determined depending on a gain resistor; and opening the load short switch associated with the deactivated amplifier device so as to insert a load resistor.

In addition, it is preferable that on a semiconductor chip, a width of each load resistor may be less than a width of the gain resistor which is connected in series with the load resistor.

A resistor formed on a semiconductor chip generally has a characteristic in that as the width narrows, the parasitic capacity decreases; however, it becomes difficult to obtain the resistance value in precision. Therefore, generating a narrow load resistor in which precision requirement is comparatively low compared with that of a gain resistor which requires a high precision makes it easier to obtain both a decrease in the parasitic capacity and precision in the resistance value.

In addition, it is preferable that in each connection of the load resistor and the gain resistor, the same value may be obtainable through addition of a value of the load resistor and a value of the gain resistor which is connected in series with the load resistor.

With this configuration, it is possible to keep the internal output loss substantially constant irrespective of which amplifier device is performing an amplification operation. Therefore, designing of a circuit for external connection is streamlined.

In addition, the photocurrent amplifier circuit further may include current signal supply switches, each of which is connected to the associated one of the device selector switches in parallel and supplies a current signal to an associated one of the light receiving circuits.

With this configuration, it is possible to supply a current signal which is not an amplification target from the current signal supply switch by short-circuiting the current signal supply switch associated with the deactivated amplifier device. This makes it possible to avoid a change in an output voltage which occurs when the current signal which is not an amplification target flows from the outputs of the differential amplifier circuit through the gain resistor and load resistor. Therefore, an output voltage with high precision can be obtained.

In addition, the photocurrent amplifier circuit further may include attenuation control circuits, each of which is configured to have an attenuation resistor and an attenuation switch connected in parallel, the attenuation control circuit being connected in series with an associated one of the input resistors and being set between the output of each of the light receiving circuits and the input of an associated one of the amplifier devices.

With this configuration, it is possible to suppress the current signal which is not an amplification target and to reduce the effect by: short-circuiting an attenuation switch associated with an amplifier device which is performing an amplification operation so as to amplify a comparatively large current signal obtained only via an input resistor; and opening the attenuation switch associated with the deactivated amplifier device so as to insert an attenuation resistor. For one of the examples, a switch with less driving ability can be applied instead of using the described current signal supply switch.

The present invention can be realized not only as such a photocurrent amplifier circuit but also as an optical pick-up device provided with such a photocurrent amplifier circuit.

With the photocurrent amplifier circuit of the present invention, only the current signal associated with the amplifier device which has not been subjected to application of an input voltage to deactivate the amplifier device is selectively amplified by a single differential amplifier circuit. This photocurrent amplifier circuit is realized by setting amplifier devices for the respective light receiving circuits in the inverting input unit of the differential amplifier circuit and device selector switches. Therefore, the space for the circuit part needed for the respective light receiving circuits is restricted to small space. By using this photocurrent amplifier circuit as an output stage, it becomes possible to realize a simple and downsized photocurrent amplifier circuit which selectively amplifies one or more of the current signals which flow in the light receiving circuits.

Further Information About Technical Background to this Application

The disclosure of Japanese Patent Application No. 2005-289088 filed on Sep. 30, 2005 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

The embodiments of the present invention are described hereinafter with reference to the diagrams.

First Embodiment

Figure 1:
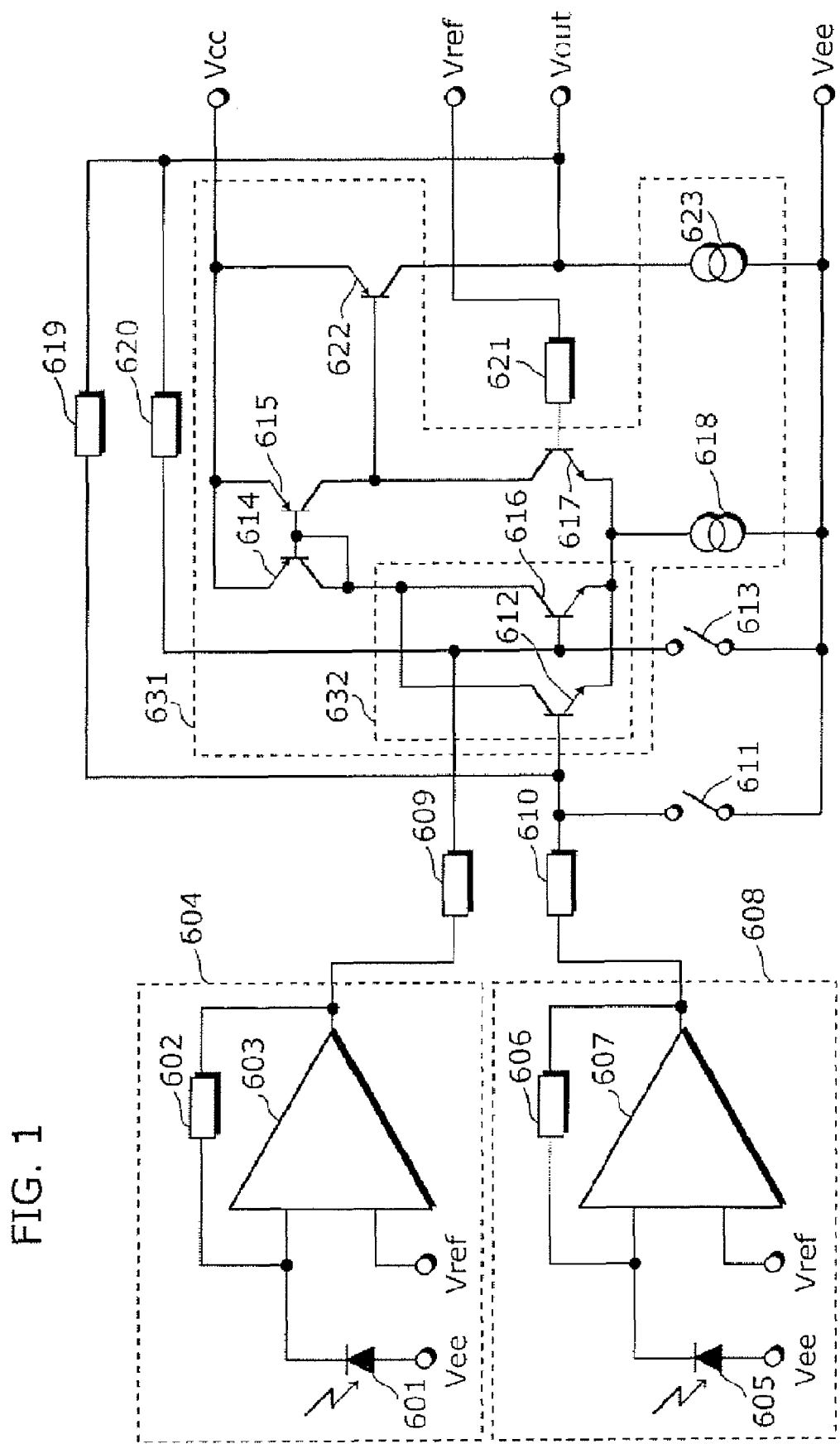
FIG. 1 is a circuit diagram showing an example of a photocurrent amplifier circuit of the first embodiment.

FIG. 1 is a circuit diagram showing an example of a photocurrent amplifier circuit according to the first embodiment of the present invention.

This photocurrent amplifier circuit is configured of light receiving circuits 604 and 608, input resistors 609 and 610, device selector switches 611 and 613, a differential amplifier circuit 631, gain resistors 619 and 620, and a non-inverting input resistor 621.

The light receiving circuits 604 and 608 are circuits which amplify, into voltage signals, respective photocurrents which flow into each of the light receiving circuits in accordance with the amount of received light so as to output the amplified voltage signals. The light receiving circuit 604 is configured of a light receiving device 601, a resistor 602 and an operational amplifier 603. The light receiving circuit 608 is configured of a light receiving device 605, a resistor 606 and an operational amplifier 607.

The differential amplifier circuit 631 is a circuit which amplifies a current signal which flows from the light receiving circuits 604 and 608 through the input resistors 609 and 610 to the gain resistors 620 and 619, and is configured of NPN transistors 612, 616, and 617, PNP transistors 614, 615, and 622, and constant current sources 618 and 623. In particular, the NPN transistors 612 and 616 are examples of amplifier devices provided in each of the light receiving circuits 608 and 604, and they are connected in parallel so as to constitute an inverting input unit 632 of the differential amplifier circuit 631.

The gain resistors 619 and 620 are feedback resistors inserted into a negative feedback circuit of the differential amplifier circuit 631, and they supply, from the output of the differential amplifier circuit 631, the current signals of each of the light receiving circuits 608 and 604. In accordance with the characteristics of the fight receiving circuits 608 and 604, resistance values of the gain resistors 619 and 620 are determined so as to obtain favorable amplification rates for the current signals.

The device selector switches 611 and 613 are selectively turned on, and a negative power voltage $V_{ee}$ is applied to the bases of the NPN transistors 612 and 616 which are associated with the respective device selector switches 611 and 613. This negative power voltage $V_{ee}$ is an example of an input voltage which deactivates the NPN transistors 612 and 616.

Among the NPN transistors 612 and 616, the deactivated one becomes opened equivalently, and the other one becomes active and performs an amplification operation. In this way, the differential amplifier circuit 631 amplifies, into a voltage signal, the current signal which flows into the gain resistor associated with one of the NPN transistors 612 and 616 which performs an amplification operation, in other words, the one in which the device selector switch is turned off so as to output the amplified voltage signal.

For example, this photocurrent amplifier circuit may be used in a light receiving unit in a simple and downsized optical pick-up device which is capable of reading and/or writing information from and/or to a CD or a DVD using lights having respectively different wavelengths.

Figure 2:
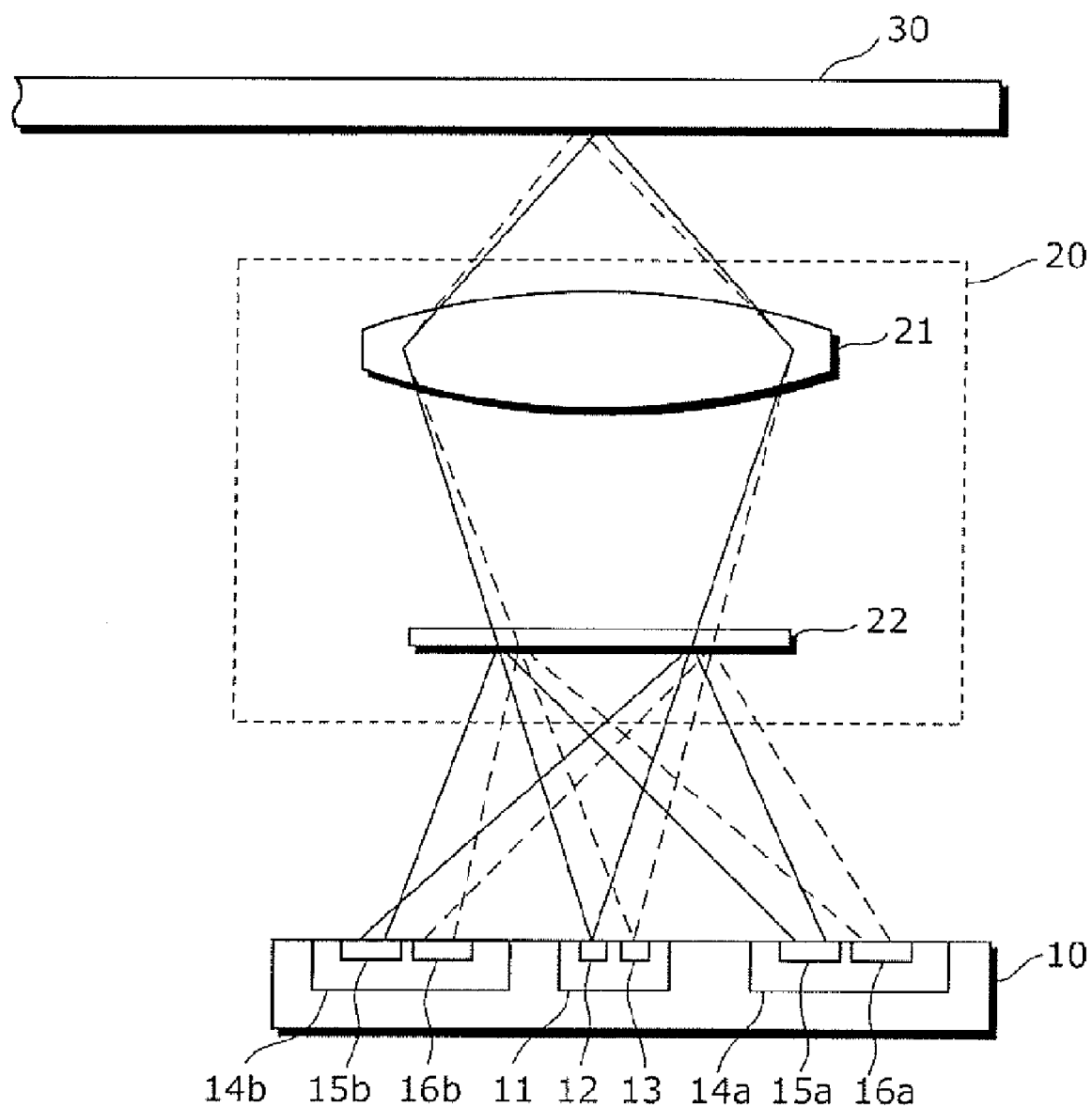
FIG. 2 is a diagram schematically showing an example of a typical configuration of an optical pick-up device.

FIG. 2 is a diagram schematically showing an example of a typical configuration of such an optical pick-up device. This optical pick-up device is configured of a semiconductor substrate 10 and an optical system 20 which is used in common for a CD and a DVD. Further, a medium 30 is illustrated in FIG. 2.

On the semiconductor substrate 10, a light emitting unit 11 and light receiving units 14a and 14b are formed. The optical system 20 is configured of an object lens 21 and a hologram device 22.

For example, the light emitting unit 11 is a two-wavelength semiconductor laser device on which light emitting points 12 and 13 are formed apart. The light emitting points 12 and 13 respectively emit an infrared laser light for CDs and a red laser light for DVDs. In FIG. 2, light paths of the infrared laser light and the red laser light are respectively shown by a solid line and a broken line.

The lights having the respective wavelengths emitted from the light emitting unit 11 pass through the object lens 21, are reflected on the medium 30, are divided in the radial direction of the medium by its hologram device 22, and are projected on the light receiving devices 15a and 16a and the light receiving devices 15b and 16b. The light receiving devices 15a and 16a are set at different positions for the respective wavelengths in the light receiving unit 14a, and the light receiving devices 15b and 16b are set at different positions for the respective wavelengths in the light receiving unit 14b.

As commonly known, the diameters of the projection spots of the respectively divided reflected lights and imbalance in the light amounts are used for control of focusing and tracking. In addition, the total light amount of the respectively reflected lights is used for reading the information.

The photocurrent amplifier circuit shown in FIG. 1 is provided, for example, in each of the light receiving units 14a and 14b in this optical pick-up device. Assuming that the respective light receiving devices 601 and 605 are intended for CDs and DVDs, the respective light receiving devices 601 and 605 correspond to the light receiving devices 15a and 16a in the light receiving unit 14a, and the respective light receiving devices 601 and 605 correspond to the light receiving devices 15b and 16b in the light receiving unit 14b.

Accordingly, the device selector switch 611 is turned on and the device selector switch 613 is turned off for CDs, while the device selector switch 611 is turned off and the device selector switch 613 is turned on for DVDs. In this way, depending on the use for CDs or DVDs, one of the NPN transistors 612 and 616 performs an amplification operation, and the other one is opened equivalently. Therefore, the current signal from a desired light receiving circuit is precisely amplified.

As described above, the photocurrent amplifier circuit of the present invention shares a circuit among the respective light receiving devices and further includes the light receiving circuits 608 and 604, the amplifier devices for the respective light receiving circuits provided in the inverting input unit 632 of the differential amplifier circuit 631, and the device selector switches. By using this differential amplifier circuit 631 in an output stage of this photocurrent amplifier circuit, it is possible to realize a simple and downsized photocurrent amplifier circuit which selectively amplifies one or more current signals which flow into light receiving circuits.

Second Embodiment

Figure 3:
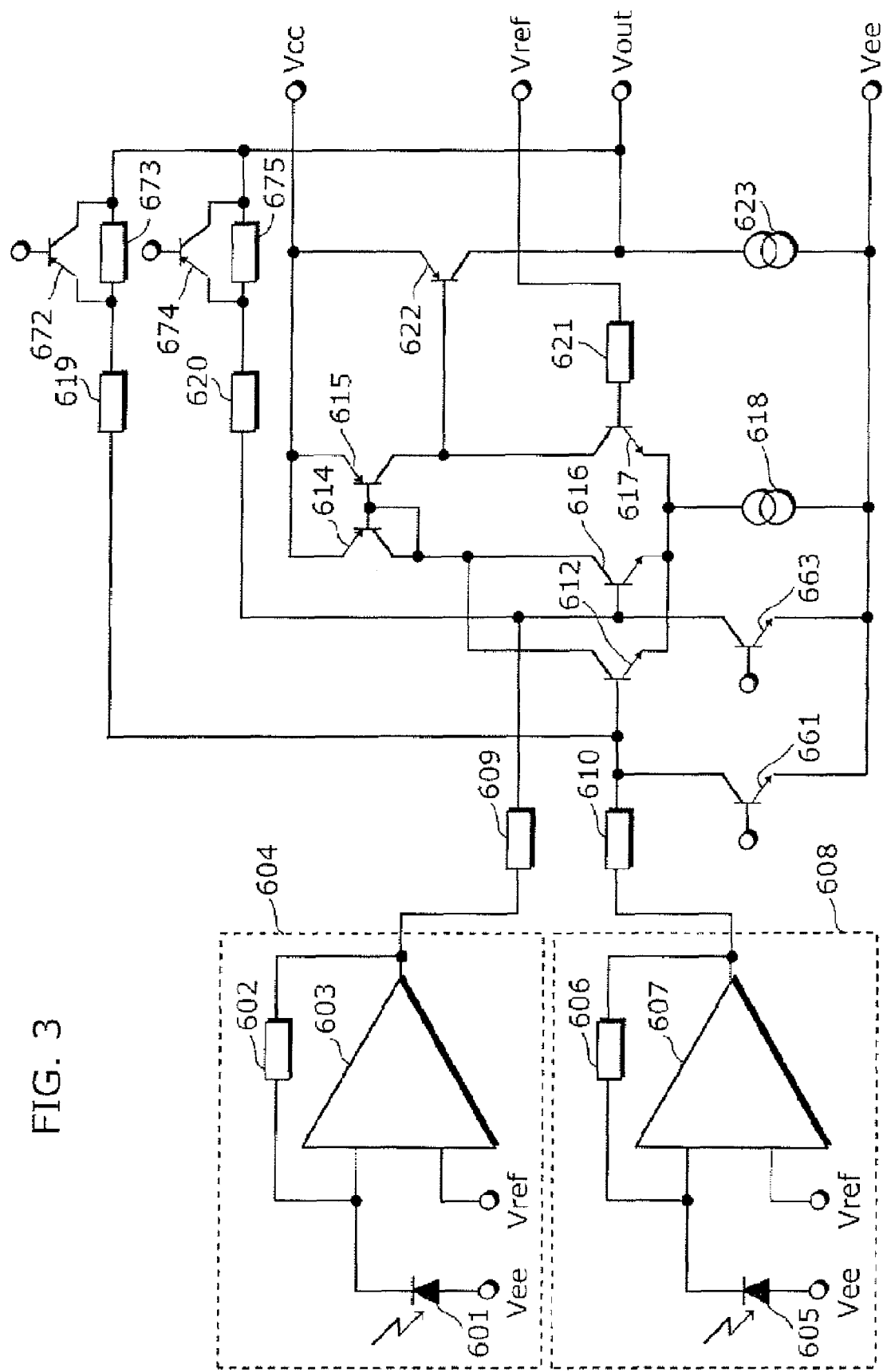
FIG. 3 is a circuit diagram showing an example of a photocurrent amplifier circuit of the second embodiment.

FIG. 3 is a circuit diagram showing an example of a photocurrent amplifier circuit according to the second embodiment of the present invention.

This photocurrent amplifier circuit is realized by NPN transistors 661 and 663 which are associated with the device selector switches 611 and 613 in the photocurrent amplifier circuit (refer to FIG. 1) of the first embodiment. In addition, in each negative feedback circuit of this photocurrent amplifier circuit, a load control circuit made up of a load resistor 673 and a load short switch 672 which are connected in parallel is inserted in series with the gain resistor 619, and a load control circuit made up of a load resistor 675 and a load short switch 674 which are connected in parallel is inserted in series with the gain resistor 620. In this example, the respective load short switches 672 and 674 are realized as PNP transistors.

First, the control of the NPN transistors 661 and 663 as device selector switches is described.

By controlling at least one of the current to be injected and the voltage to be applied to the bases of the respectively corresponding NPN transistors 661 and 663, it is possible to switch the states of the NPN transistors 612 and 616 between a deactivated state and an active state.

In order to deactivate the NPN transistor 612 in accordance with the base current to be injected to the NPN transistor 661, a base current has only to be injected to the NPN transistor 661. The base current is a current which produces a collector current enough to make the collector voltage of the NPN transistor 661 (in other words, the base voltage of the NPN transistor 612) lower than the emitter voltage of the NPN transistor 612 by a voltage drop which occurs in the gain resistor 619. Note that the voltage lower than the emitter voltage of the NPN transistor 612 is an example of an input voltage which deactivates the NPN transistor 612.

In addition, in order to activate the NPN transistor 612, a base current has only to be injected to the NPN transistor 661. The base current is a current which produces a collector current which is enough to prevent the collector voltage of the NPN transistor 661 from becoming lower than the emitter voltage of the NPN transistor 612. At this time, a specific value of the base current may be determined as, for example, 0A or below (in other words, the base current is pulled or does not flow).

On the other hand, in order to deactivate the NPN transistor 612 in accordance with the base voltage to be applied to the NPN transistor 661, it is required to apply the base voltage which saturates the NPN transistor 661. Additionally, in order to activate the NPN transistor 612 in accordance with the base voltage to be applied to the NPN transistor 661, it is required to apply the base voltage which deactivates the NPN transistor 661.

Note that it is obvious that there is the same relationship between the NPN transistor 663 and the NPN transistor 616.

Next, the load resistors 673 and 675, and load short switches 672 and 674 are described.

In the case where the NPN transistors 612 or 616 is deactivated, considering that the gain resistors 619 or 620 associated with the NPN transistors 612 and 616 functions as internal load resistors and causes the output loss, it is desirable that the resistance values is as high as possible.

However, as described above, the resistance values of the gain resistors 619 and 620 are determined so as to obtain favorable amplification rates for the photocurrents. Therefore, in the case where no high amplification rates are required when, for example, the light receiving devices 605 and 601 receive high-output laser light for writing, the resistance values of the gain resistors 619 and 620 are determined as comparatively low values.

Thus, in the case where the NPN transistors 612 and 616 are active and are performing amplification operations, the photocurrents are amplified at desired amplification rates by short-circuiting the load short switches 672 and 674 associated with the NPN transistors 612 and 616 and configuring a negative feedback circuit by substantially using the gain resistors only. In addition, in the case where the NPN transistors 612 and 616 are deactivated, the internal load resistance values are kept high by opening the load short switches 672 and 674 associated with the NPN transistors 612 and 616 and by inserting the load resistors into the negative feedback circuit. In this way, it is possible to realize both accurate amplification rates and low output loss.

It is desirable that the resistance values of the load resistors 673 and 675 are as high as possible for the use. For example, it is desirable that they are greater than the values of the gain resistors 619 and 620 associated with the load resistors 673 and 675.

In addition, on a semiconductor chip, it is desirable that the widths of the load resistors 673 and 675 are narrower than the widths of the gain resistors 619 and 620 which are respectively connected to the load resistors 673 and 675 in series.

In general, a resistor formed on a semiconductor chip has a characteristic that as the width narrows, the parasitic capacity decreases; however, it becomes difficult to obtain the resistance value in precision. Therefore, generating a narrow load resistor in which precision requirement for the resistance values is comparatively low compared with that of a gain resistor which requires a high precision makes it easier to obtain both a decrease in the parasitic capacity and precision in the resistance value.

In addition, it is desirable that the value obtainable by addition of the resistance value of the load resistor 673 to the resistance value of the gain resistor 619 is equal to the value obtainable by addition of the resistance value of the load resistor 675 to the resistance value of the gain resistor 620.

If so, the internal output loss can be kept constant irrespective of whether the NPN transistor 612 or whether the NPN transistor 616 is performing an amplification operation. Therefore, designing of a circuit for external connection can be streamlined.

Third Embodiment

Figure 4:
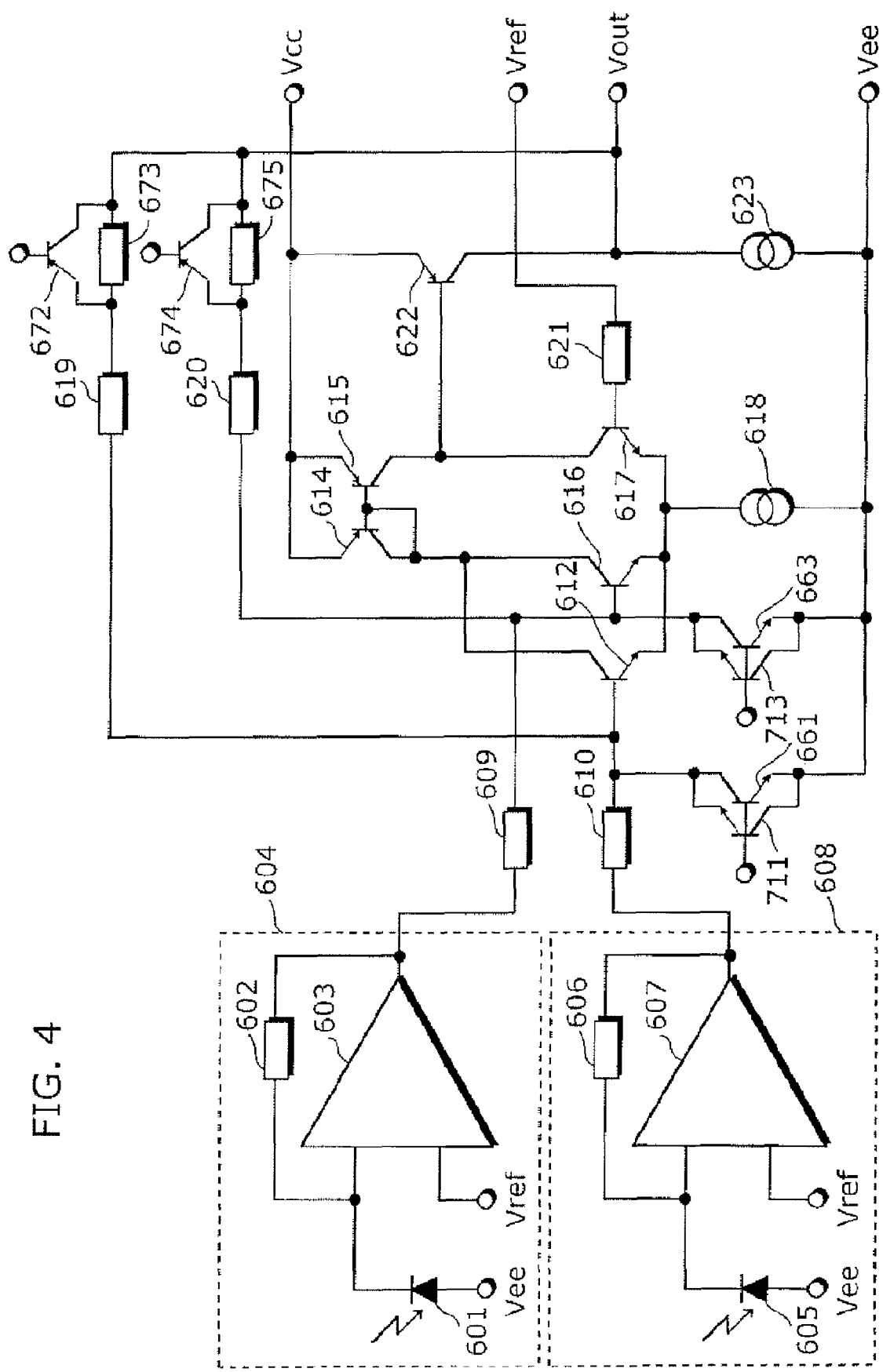
FIG. 4 is a circuit diagram showing an example of a photocurrent amplifier circuit of the third embodiment.

FIG. 4 is a circuit diagram showing an example of a photocurrent amplifier circuit according to the third embodiment of the present invention.

This photocurrent amplifier circuit is configured by additionally providing current signal supply switches 711 and 713 which supply current signals to the light receiving circuit 608 and 604 respectively and which are connected in parallel with the NPN transistors 661 and 663 respectively according to the second embodiment. In this example, the current signal supply switches 711 and 713 are realized by the respective NPN transistors.

The emitter and collector of the current signal supply switch 711 are respectively connected to the collector and emitter of the NPN transistor 661, and the current signal supply switch 711 and the NPN transistor 661 are connected to have a common base.

During the period when a current signal from the light receiving circuit 608 is not an amplification target, the NPN transistor 661 is turned on, the load short switch 672 is turned off, and the current signal supply switch 711 is turned on. The current signal from the light receiving circuit 608 flows from the current signal supply switch 711 without passing through the negative feedback circuit.

This eliminates a change in the output voltage which occurs when the current signal which is not an amplification target flows from the output of the photocurrent amplifier circuit through the gain resistor 619 and the load resistor 673. Therefore, an output voltage with high precision can be obtained.

During the period when the current signal from the light receiving circuit 608 is an amplification target, the NPN transistor 661 is turned off, the load short switch 672 is turned on, and the current signal short switch 711 is turned off. The current signal from the light receiving circuit 608 flows from the output of the photocurrent amplifier circuit through the negative feedback circuit to be amplified.

Note that it is obvious that there is the same relationship between the NPN transistor 663, the load short switch 674, and the current signal short switch 713.

Fourth Embodiment

Figure 5:
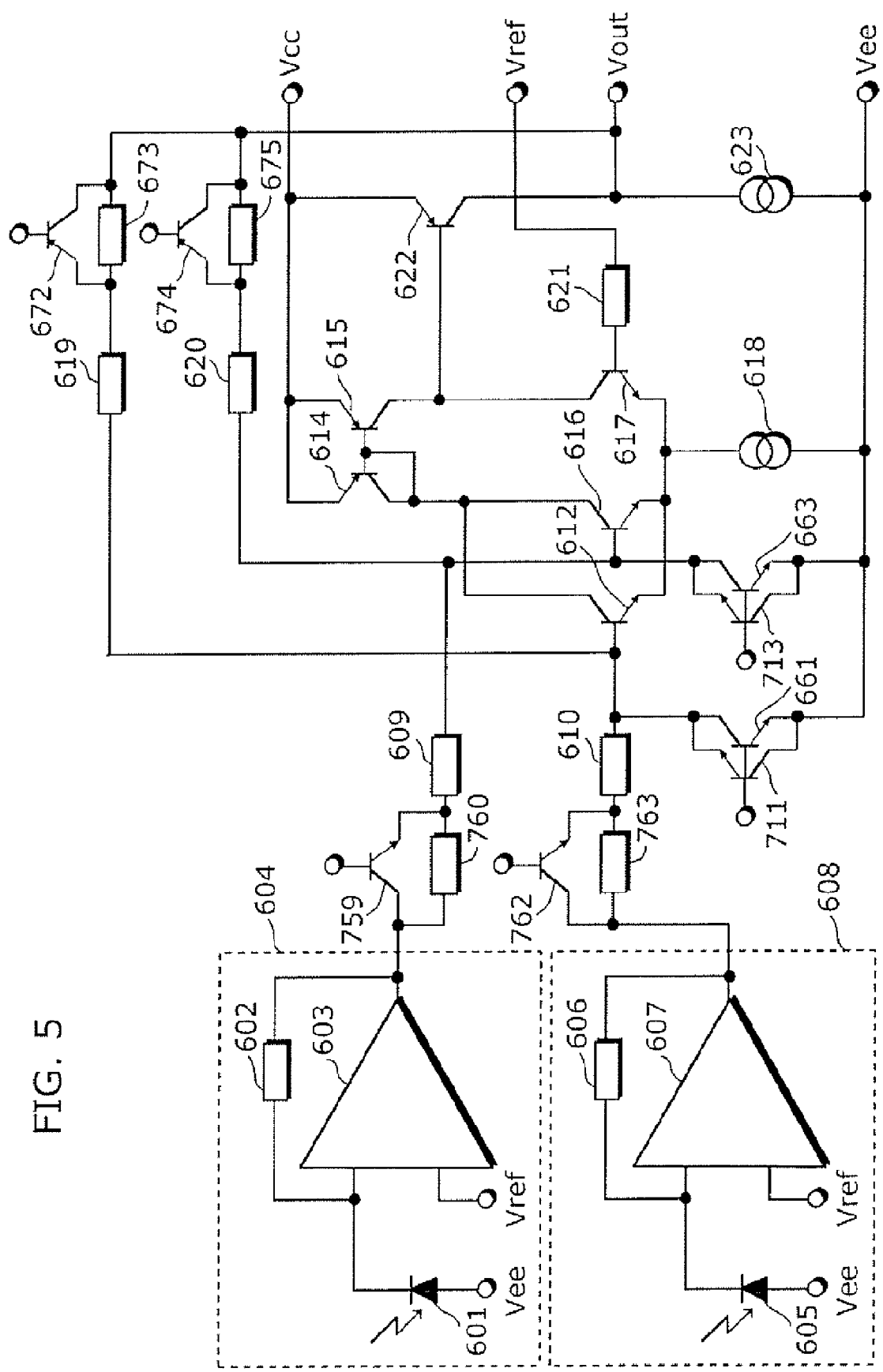
FIG. 5 is a circuit diagram showing an example of a photocurrent amplifier circuit of the fourth embodiment.

FIG. 5 is a circuit diagram showing an example of a photocurrent amplifier circuit according to the fourth embodiment of the present invention.

This photocurrent amplifier circuit is configured by inserting, between the light receiving circuit 604 and input resistor 609 of the photocurrent amplifier circuit (refer to FIG. 4) of the third embodiment, a attenuation control circuit in which an attenuation resistor 760 and an attenuation switch 759 are connected in parallel. In addition, the photocurrent amplifier circuit is configured by inserting, between the light receiving circuit 608 and input resistor 610, a attenuation control circuit in which an attenuation resistor 763 and an attenuation switch 762 are connected in parallel. In this example, the attenuation switches 759 and 762 are realized by the respective NPN transistors.

It is desirable that current signals from the light receiving circuits 604 and 608 are large in amount to a certain degree so as to obtain a favorable noise characteristic during a period when the current signals are amplification targets, and that the current signals are small in amount to a certain degree so as to avoid unnecessary effect during a period when the current signals are not amplification targets.

In order to satisfy such a requirement, the attenuation resistors 760 and 763 are selectively inserted in a signal input path in accordance with states of the attenuation switches 759 and 762.

During a period when the current signal from the light receiving circuit 608 is not an amplification target, the current signal from the light receiving circuit 608 can be suppressed by turning off the attenuation switch 762 and inserting the attenuation resistor 763 in the signal input path. In the case where the input resistor 610 is solely provided in the input path, the amount of the current signal from the light receiving circuit 608 may exceed the maximum limit of the amount of current which can flow into the NPN transistor 661 and current signal supply switch 711. As a result, the excessive amount of the current may flow into the negative feedback circuit and give the negative impact on the output. However, the insertion of the attenuation resistor 763 helps suppress the signal current and avoid the negative impact.

On the other hand, during a period when the current signal from the light receiving circuit 608 is an amplification target, it is possible to flow a large amount of a current signal in the case where the attenuation switch 762 is turned on and the input path is configured substantially only to have the input resistor 610.

It is obvious that there is the same relationship between the light receiving circuit 604, attenuation switch 759, attenuation resistor 760 and input resistor 609.

Note that it is possible to switch on/off of the attenuation switches 759 and 762 by controlling each base current.

As the described relationship between the load resistor and gain resistor, the following relationship exists between the attenuation resistor and input resistor.

It is desirable that the resistance values of the attenuation resistors 760 and 763 are as high as possible for the use. For example, it is desirable that they are greater than the values of the input resistors 609 and 610 associated with the attenuation resistors 760 and 763.

In addition, on a semiconductor chip, it is desirable that the widths of the attenuation resistors 760 and 763 are narrower than the widths of the in put resistors 609 and 610 which are respectively connected to the attenuation resistors 760 and 763 in series.

In addition, it is desirable that the value obtainable by addition of the resistance value of the attenuation resistor 760 to the resistance value of the input resistor 609 is equal to the value obtainable by addition of the resistance value of the attenuation resistor 763 to the resistance value of the input resistor 610.

If so, the characteristic of the signal input path can be kept constant irrespective of whether the NPN transistor 612 or whether the NPN transistor 616 is performing an amplification operation. Therefore, designing of a circuit can be streamlined.

(Variation)

The earlier descriptions have been provided assuming that the number of light receiving devices is two for convenience, but of course, the circuit may be configured to have three or more light receiving devices which respectively have device selector switches. Also in this case, it is possible to obtain such photocurrent amplifier circuit that selectively amplifies, by a single differential amplifier circuit, only the photocurrent associated with the amplifier device which has not been subjected to application of an input voltage to deactivate the amplifier device.

The elements required for each light receiving device are limited to amplifier devices of the inverting input unit in the differential amplifier circuit and device selector switches. Therefore, as the number of the light receiving devices increases, the effect of downsizing a circuit becomes more remarkable.

The configuration, for example, having three light receiving devices is suitable for realizing a simple and downsized three-wavelength optical pick-up device compliant not only with CDs and DVDs but also with BDs capable of recording and reading, using blue-violet laser light, information requiring a capacity larger than those required for CDs and DVDs. Thus, the utility value is high.

In addition, in the earlier descriptions, an application of the present invention as an optical pick-up device has been described as an example providing a remarkable downsizing effect. However, it is obvious that the photocurrent amplifier circuit of the present invention can be widely used as an amplifier circuit which selectively amplifies one or more current signals which are obtainable from light receiving circuits, in addition to as an optical pick-up device.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The photocurrent amplifier circuit of the present invention can be widely used as an amplifier circuit which selectively amplifies one or more current signals which are respectively obtainable from light receiving circuits. In particular, the present invention is suitable for use in a light receiving unit in a simple and downsized optical pick-up device which is capable of information reading and/or writing, from and/or to plural kinds of optical disc media, using lights with different wavelengths.

What is claimed is:

1. A photocurrent amplifier circuit comprising:
    a differential amplifier circuit configured to have an input unit including amplifier devices which are connected in parallel;
    device selector switches, each of which is set for an associated one of said amplifier devices and applies an input voltage to said associated amplifier device, the input voltage deactivating said amplifier device;
    gain resistors, each of which connects an input of an associated one of said amplifier devices with an output of said differential amplifier circuit;
    light receiving circuits, each of which is set for an associated one of said amplifier devices and generates a voltage signal in accordance with an amount of received light; and
    input resistors, each of which connects an input of an associated one of said light receiving circuits with an output of each of said amplifier devices,
    wherein said differential amplifier circuit amplifies a current signal which flows from each of said light receiving circuits via an associated one of said input resistors into an associated one of said gain resistors.

2. The photocurrent amplifier circuit according to claim 1, further comprising
    load control circuits, each of which is configured to have a load resistor and a load short switch connected in parallel, said load control circuit being connected in series with an associated one of said gain resistors and being set between the output of said differential amplifier circuit and the input of an associated one of said amplifier devices.

3. The photocurrent amplifier circuit according to claim 2, wherein each load resistor has a value which is greater than a value of said gain resistor which is connected in series with said load resistor.

4. The photocurrent amplifier circuit according to claim 2, wherein, on a semiconductor chip, a width of each load resistor is less than a width of said gain resistor which is connected in series with said load resistor.

5. The photocurrent amplifier circuit according to claim 2, wherein, in each connection of said load resistor and said gain resistor, a same value is obtainable through addition of a value of said load resistor and a value of said gain resistor which is connected in series with said load resistor.

6. The photocurrent amplifier circuit according to claim 1, further comprising
current signal supply switches, each of which is connected to an associated one of said device selector switches in parallel and supplies a current signal to an associated one of said light receiving circuits.

7. The photocurrent amplifier circuit according to claim 1, further comprising
attenuation control circuits, each of which is configured to have an attenuation resistor and an attenuation switch connected in parallel, said attenuation control circuit being connected in series with an associated one of said input resistors and being set between the output of each of said light receiving circuits and the input of an associated one of said amplifier devices.

8. The photocurrent amplifier circuit according to claim 7, wherein each attenuation resistor has a value which is greater than a value of said input resistor which is connected in series with an associated one of said attenuation resistor.

9. The photocurrent amplifier circuit according to claim 7, wherein, on a semiconductor chip, a width of each attenuation resistor is less than a width of said input resistor which is connected in series with an associated one of said attenuation resistor.

10. The photocurrent amplifier circuit according to claim 7, wherein, in each connection of said attenuation resistor and said input resistor, a same value is obtainable through addition of a value of said attenuation resistor to a value of said input resistor which is connected in series with said attenuation resistor.

11. An optical pick-up device which is capable of (a) reading information from or (b) reading information from and writing onto plural types of optical disc media by using lights having different wavelengths, comprising
a photocurrent amplifier circuit including:
a differential amplifier circuit configured to have an input unit including amplifier devices which are connected in parallel;
device selector switches, each of which is set for an associated one of said amplifier devices and applies an input voltage to said associated amplifier device, the input voltage deactivating said amplifier device;
gain resistors, each of which connects an input of an associated one of said amplifier devices with an output of said differential amplifier circuit;
light receiving circuits, each of which is set for an associated one of said amplifier devices and generates a voltage signal in accordance with an amount of received light; and
input resistors, each of which connects an input of an associated one of said light receiving circuits with an output of each of said amplifier devices,
wherein said light receiving circuits in said photocurrent amplifier circuit receive the lights having different wavelengths.

* * * * *